United States Patent [19]

Heller et al.

[11] 4,072,939
[45] Feb. 7, 1978

[54] ANALOG-TO-DIGITAL AND DIGITAL-TO-ANALOG CONVERTER CIRCUITS EMPLOYING CHARGE REDISTRIBUTION

[75] Inventors: Lawrence Griffith Heller, Brewster; Lewis Madison Terman, South Salem, both of N.Y.

[73] Assignee: International Business Machines Corporation, Armonk, N.Y.

[21] Appl. No.: 662,626

[22] Filed: Mar. 1, 1976

[51] Int. Cl.² ........................................... H03K 13/03
[52] U.S. Cl. ...................... 340/347 AD; 340/347 M; 307/221 D; 357/24
[58] Field of Search ... 340/347 AD, 347 M, 347 DA; 307/221 R, 221 C, 221 D; 357/24; 235/154; 324/99 D

[56] References Cited
U.S. PATENT DOCUMENTS

| 3,626,408 | 12/1971 | Carbrey | 340/347 AD |
| 3,930,255 | 12/1975 | Means | 340/347 AD |
| 3,983,408 | 9/1976 | Adam et al. | 307/221 D |

OTHER PUBLICATIONS

Hoeschele, Analog-to-Digital ... Techniques, J. Wiley & Sons, Inc., 8/1968, pp. 416–421.
Mok et al., A Charge-Transfer-Device Logic Cell, Solid State Electronics, 1974, vol. 17, pp. 1147, 1151 & 1152.
Analog-to-Digital Converter, Control Engineering, vol. 4, No. 2, 2/1957, p. 71.

*Primary Examiner*—Thomas J. Sloyan
*Attorney, Agent, or Firm*—John J. Goodwin

[57] ABSTRACT

Analog-to-digital (A/D) and digital-to-analog (D/A) converter circuits are provided using charge redistribution. The analog-to-digital converter circuit also employs successive approximation binary search techniques wherein the number of search voltages generated is a minimum. The analog-to-digital circuit includes a digital-to-analog converter circuit, a comparator circuit and a logic control means. The digital-to-analog circuit, under control of the logic means, accepts a reference voltage input and produces a sequence of search voltages which are compared with an unknown analog input voltage at the comparator. The resultant outputs from the comparator are applied to the control logic to determine the search voltage sequence. The digital-to-analog converter for the aforesaid circuit is provided in one embodiment employing charge-coupled-device technology. A substrate and two storage electrodes are combined to produce two potential storage wells and a transfer electrode is provided to move charge carriers between the storage wells. A reference charge packet $Q_R$ is stored and divided by charge redistribution between the two potential wells to produce a sequence of charge packets of value $Q_R/2$, $Q_R/4$, $Q_R/8$, $Q_R/16$ etc. which can be selectively combined to produce analog output of a D/A converter. In the A/D converter the same sequence of charge packets is used to generate the equivalent of a binary search sequence $Q_R/2$, $Q_R/2\pm Q_R/4$, $Q_R/2\pm Q_R/4\pm Q_R/8$ etc. In another embodiment a bucket brigade device is provided to accomplish the same result. Because of the technique of charge redistribution wherein precise amounts of charge can be shifted in either direction between storage means, the total number of search value steps is a minimum.

4 Claims, 11 Drawing Figures

ANALOG-TO-DIGITAL AND DIGITAL-TO-ANALOG CONVERTER CIRCUITS EMPLOYING CHARGE REDISTRIBUTION

BACKGROUND OF THE INVENTION

1. Field of the Invention

The present invention relates to digital-to-analog and analog-to-digital converter circuits and more particularly to converter circuits employing charge redistribution and transfer techniques and analog-to-digital converter circuits to produce search values for a successive approximation type search used in the conversion technique.

2. Description of the Prior Art

Analog-to-digital and digital-to-analog converter circuits which use combinations of capacitors and switches to produce search voltages and analog signals are known in the art. A circuit of this type is described in the publication "An All-MOS Charge-Redistribution A/D Conversion Technique", R. E. Suarez, P. R. Gray and D. A. Hodges, 1974/SSCC Digest, p. 194, February 1974. In this circuit, at certain places in the approximation it may be impossible to generate the next search value directly and in which case it is necessary to start the entire sequence over. In the present invention, because of the use of charge transfer technology and the unique method of operation, the approximation sequence can always be carried out directly. The present invention also overcomes inherent disadvantages associated with the use of switches and capacitors.

SUMMARY OF THE INVENTION

An object of the present invention is to provide improved analog-to-digital and digital-to-analog converter circuits employing charge redistribution.

Another object of the present invention is to provide improved analog-to-digital and digital-to-analog converter circuits incorporating charge transfer techniques.

A further object of the present invention is to provide N bit analog-to-digital converter circuits using successive approximation binary search techniques requiring only N search steps.

Still another object of the present invention is to provide analog-to-digital and digital-to-analog converter circuits including charge-coupled-devices.

The foregoing and other objects, features and advantages of the invention will be apparent from the following more particular description of a preferred embodiment of the invention, as illustrated in the accompanying drawings.

DETAILED DESCRIPTION OF THE INVENTION

Figure 1:
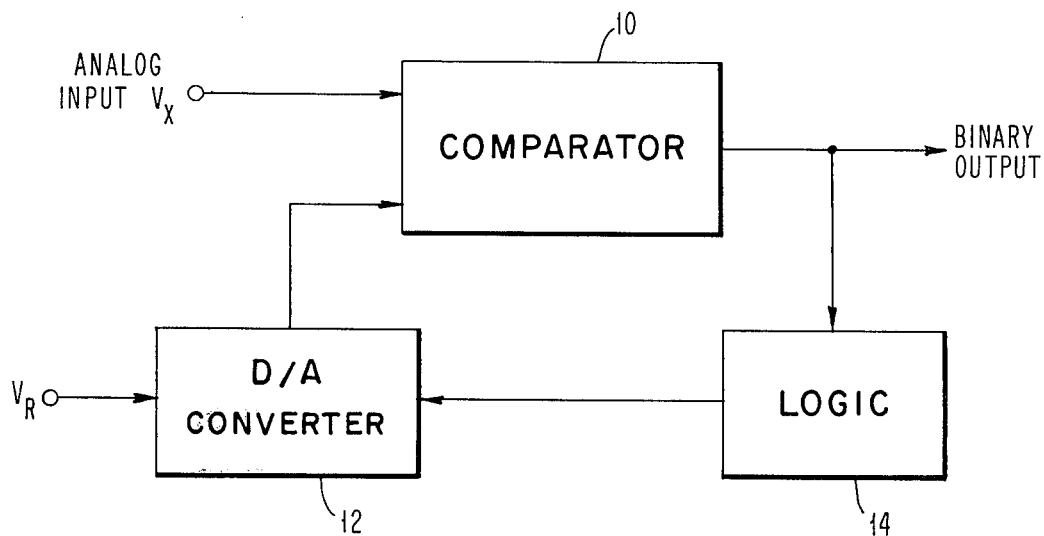
FIG. 1 is a schematic block diagram of an embodiment of an analog-to-digital converter used in the explanation of the present invention.

The present invention relates to analog-to-digital and digital-to-analog converter circuits. Assume an analog voltage $V_x$ which is to be converted to digital representation and that the analog voltage $V_x$ lies within a range 0 to a maximum i.e., 0 to $V_R$ (full scale). $V_x$, which is unknown, is a fraction of the full scale representation and by determining the fraction of the full scale, $V_x$ can be represented by a binary number.

One technique is to perform a search on the unknown voltage $V_x$ by comparing it with a sequence of known voltage steps $V_s$ which are fractions of $V_R$. For example one type search is to directly compare the level of the unknown $V_x$ with fractions of a known reference voltage. For example, if a six bit binary word is desired there will be 64 ($2^6$) possible levels. The input $V_x$ is then compared in separate steps with increasing increments $V_s$ of the reference voltage $V_R$ at each possible level and the comparator will indicate when the input $V_x$ exceeds the particular reference level and this determines the level of the input $V_x$. Thus $V_x$ is compared to a first level $V_s$ which is $V_R/64$ and if $V_s$ less than $V_x$, $V_x$ is then compared to level 2 (i.e., $V_s = 2V_R/64$) and if $V_s$ is less is then $V_x$, $V_x$ is compared to level 3 (i.e. $V_s = 3V_R/64$) and so on until, for example, $V_x$ is found to be below level 47. It is then known that $V_x$ is between 46 and 47 on a scale of 0 to 63 and its digital representation of 101110 can be assigned.

The drawback with the aforesaid technique is that a total of $2^N$ separate comparisons (64 in the given example) may be required which is expensive and time consuming.

A more efficient scheme is known as a binary search. First the unknown input voltage $V_x$ is compared with a reference voltage of one-half the total range (i.e., 32). If the comparison indicates that $V_x$ is greater than $V_R/2$ then the first or most significant digit of the digital representation of $V_x$ will be "1"; if the comparison indicates the level of $V_x$ is below $V_R/2$ then the most significant digit is "0". In either case, the first comparison eliminates any need for future comparison on one half the total range of $V_R$, either the bottom half or the top half of the range depending on whether the first comparison was greater ("1") or less ("0") than $V_R/2$.

A second comparison is then made. If the first bit was a "1", $V_x$ is now compared with $3V_R/4$ to determine if $V_x$ lies between $V_R/2$ and $3V_R/4$ or $3V_R/4$ and $V_R$. If $V_x$ is less than $3V_R/4$ the second digit is "0" and if greater than $3V_R/4$ the second digit is "1".

Similarly, if the first comparison had indicated that $V_x$ was less than $V_R/2$ (first bit "0") then $V_x$ is compared to $V_R/4$ to determine if it is between 0 and $V_R/4$ (second bit "0") or $V_R/4$ and $V_R/2$ (second bit "1"). This sequence of comparisons is then continued to determine the rest of the binary digits.

In this technique, known as a successive approximation binary search, only N total comparisons need be made to determine an N bit binary representation of $V_x$. Prior art analog-to-digital converters use this form of binary search to produce the sequence for a N-bit conversion as follows:

$$V_R/2, \ V_R/2 \pm V_R/4, \ V_R/2 \pm V_R/4 \pm V_R/8 \text{ up to } V_R/2 \ldots \pm V_R/2^N \quad [1]$$

FIG. 1 illustrates a schematic diagram of a typical successive approximation analog-to-digital converter which carries out expression [1]. The unknown voltage $V_x$ is applied to a comparator 10 and compared with the sequence of search voltages according to equation [1]. Thus, a generator must be provided for producing the search voltages ($V_R/2$), ($3V_R/4$ or $V_R/4$), ($7V_R/8$, $5V_R/8$, $3V_R/8$ or $V_R/8$), ($15V_R/16$, $13V_R/16$, $11V_R/16$, $9V_R/16$ ... or $V_R16$), ($31V_R/32$, $29V_R/32$ ... or $V_R/32$) and ($63V_R/64$, $61V_R/64$ ... or $V_R/64$) if N = 6. A generator to produce such voltages can be a typical digital-to-analog converter 12, the sequence of which is controlled by logic means 14 and which provides the appropriate analog search voltage level depending on the previous comparison from comparator 10 applied to control logic means 14. The first search voltage value applied to comparator 10 is, of course, $V_R/2$.

A specific digital-to-analog converter which can be used as the converter 12 in FIG. 1 is the two capacitor circuit described in the publication "An ALL-MOS Charge-Redistribution A/D Conversion Technique", R. E. Suarez, P. R. Gray and D. A. Hodges, 1974 ISSCC Digest, p. 194, February 1974. This two capacitor circuit is shown in FIG. 2 and consists of two equal capacitors C1 and C2 and three switches S1, S2 and S3 under logic control.

Figure 2:
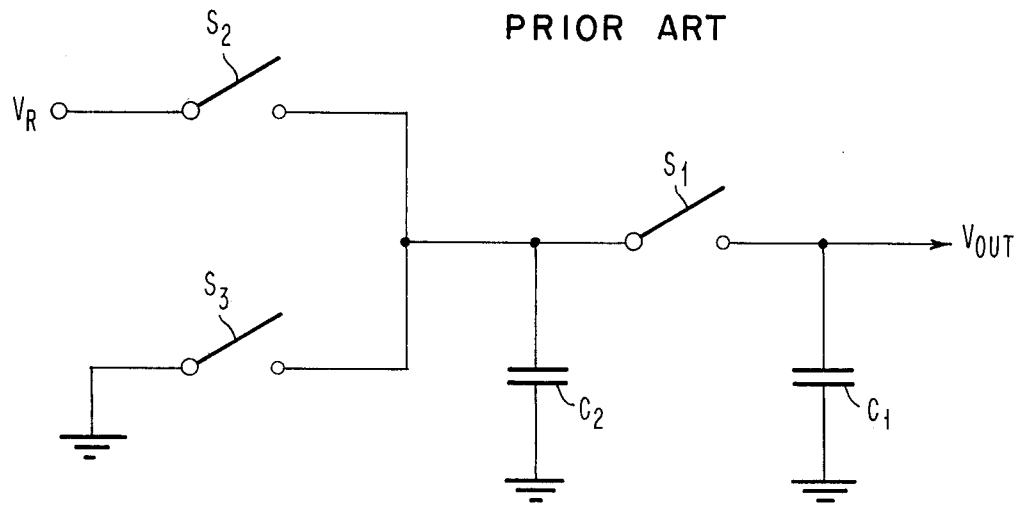
FIG. 2 is a schematic illustration of a digital-to-analog converter circuit known in the prior art.

In FIG. 2, the digital-to-analog conversion begins with both capacitors discharged and is accomplished serially by considering the least significant bit $b_0$ first. If this bit is a one, S2 is closed momentarily charging C2 to $V_R$; if it is a zero, C2 is left discharged. Switch S1 is then closed momentarily sharing charge between the capacitors and resulting in a voltage $V_{out}$ of $$V_{out} = \left[ \frac{b_0 V_R}{2} \right]$$

Leaving the charge on C1, the precharging of C2 is repeated, this time considering the next least significant bit $b_1$. After redistribution, the output voltage is $$V_{out} = \frac{b_0 V_R}{4} + \frac{b_1 V_R}{2}$$

This repetitive procedure can be carried out for higher order bits.

Thus, the circuit of FIG. 2 can be sequenced in different ways under the control of a logic means to provide all the necessary search voltages specified hereinabove by the principle of voltage redistribution in sequence between capacitors C1 and C2.

The digital-to-analog converter circuit of FIG. 2 however, suffers the limitations of relatively low speed when used to generate binary search levels on an analog-to-digital converter. For example, if $V_x$ were slightly below one-half $V_R$ (i.e., $7V_R/16$) the circuit of FIG. 2 would first generate $V_R/2$ and a comparison would indicate that $V_x$ is lower than $V_R/2$. The circuit would next generate $V_R/4$ and a compare would indicate that $V_x$ is greater than $V_R/4$ and that a compare must be made on $3V_R/8$. However the circuit of FIG. 2 can not, at this point, generate $3V_R/8$ as a next step, but must go back and start over and then generate the sequence $V_R/2$, $3V_R/4$ and $3V_R/8$. The aforesaid publication states that many patterns require this type of restarting, and that for N bits using N comparisons, (N) (N+1) voltage redistributions by C1 and C2 could be required to produce the N search voltages.

Also the circuit of FIG. 2 is relatively inaccurate due to the parasitic capacitance associated with the switches, capacitor non-linearity, and capacitor matching.

In the present invention, a digital-to-analog converter circuit using charge transfer techniques such as charge-coupled-device technology or bucket-brigade technology is described which can be employed with a standard comparator circuit as in FIG. 1 to provide an analog-to-digital converter circuit. The charge transfer digital-to-analog circuit of the present invention employs charge transfer between CCD storage wells or capacitors in bucket brigade technology to effect the successive approximation binary search and therefrom eliminates the disadvantages exhibited by prior art techniques. For example, in the present invention only N charge redistributions are required rather than the maximum (N) (N+1) redistributions of the prior art. Other advantages such as the capability to transfer all the charge from a storage element rather than to share the charge between two capacitors and the capability to move the charge back and forth very precisely will also be evident from a discussion of FIGS. 3, 4 and 5.

Figure 3:
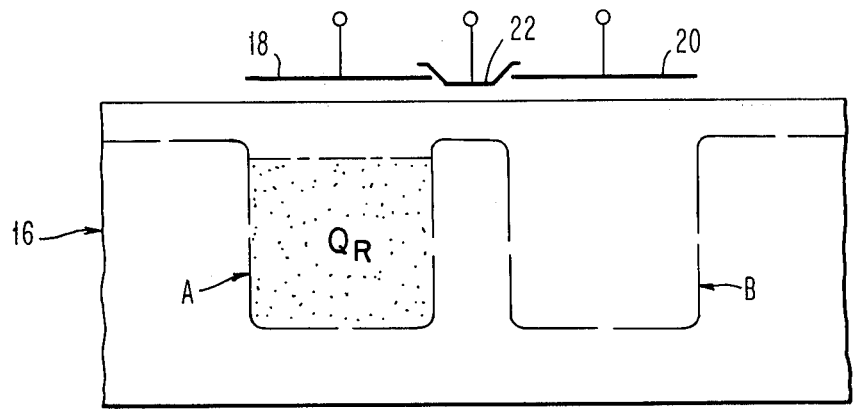
FIGS. 3, 4 and 5 are schematic illustrations of the operation of a charge-coupled-device which may be employed as a digital-to-analog converter in the present invention.
Figure 4:
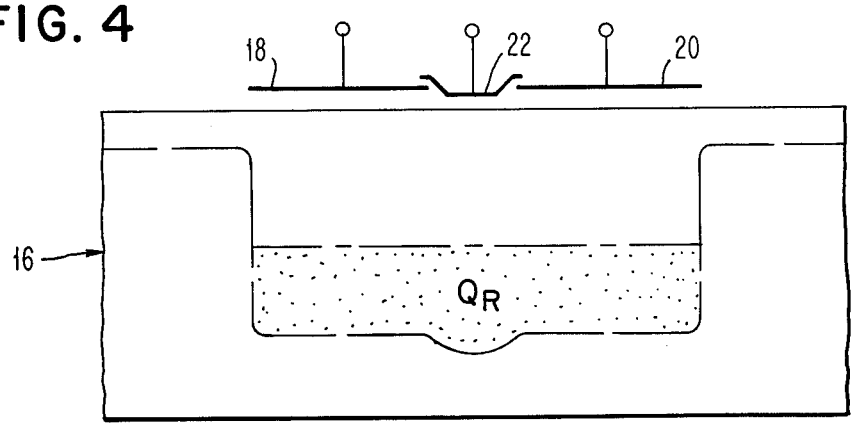
Figure 5:
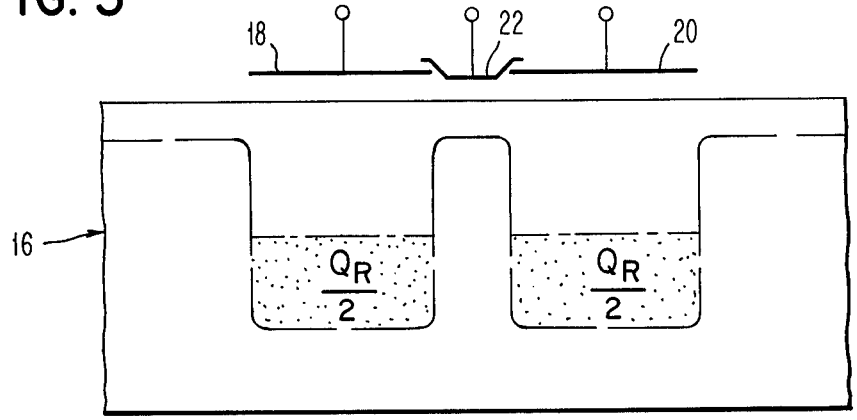

FIGS. 3, 4 and 5 depict the operation of a charge-coupled-device capable of forming two potential storage wells and shifting precise selected amounts of charge between the wells. The charge-coupled-device structure includes a semiconductor substrate 16, storage electrodes 18 and 20 and transfer electrode 22 which are connected to suitable pulse sources (not shown).

The structure illustrated in FIGS. 3, 4 and 5 operates in a conventional charge-coupled-device manner wherein potential wells are formed under storage electrodes 18 and 20 when appropriate voltage is applied to the electrodes. The potential wells A and B are capable of storing charge carriers and transfer gate 22 is provided for shifting precise amounts of charge carriers back and forth between the potential wells A and B when appropriate voltage patterns are applied to electrodes 18, 20 and 22. An explanation of how a typical charge-coupled-device operates is provided in the book entitled "Charge Transfer Devices" by Carlo H. Sequin and Michael F. Tompsett, published by Academic Press, Inc. and copyrighted in 1975 by Bell Telephone Laboratories, Incorporated (Library of Congress Catalog Card Number: 63-12814). The structure illustrated in FIGS. 3, 4 and 5 can be employed in digital-to-analog and analog-to-digital converter circuits.

Thus, one skilled in the art knows that a quantity of charge, or charge packet $Q_R$ may be injected into one well A as in FIG. 3, redistributed between wells A and B by means of electrode 22, and then isolated into wells A and B, thereby divided $Q_R$ between the two wells A and B such that each well contains a quantity $Q_R/2$. Then one of the two wells is emptied and the removed quantity $Q_R/2$ is stored elsewhere. The remaining quantity $Q_R/2$ in the unemptied well is similarly divided such that each well A and B contains a quantity $Q_R/4$. Again, one of the wells is emptied and the removed quantity $Q_R/4$ can be stored elsewhere. The remaining quantity $Q_R/4$ in the unemptied well is similarly divided such that each well now contains a quantity $Q_R/8$. One of these $Q_R/8$ quantities is removed and can again be stored elsewhere and the other $Q_R/8$ quantity remains in order to be divided into two $Q_R/16$ amounts.

It can be seen that the structure illustrated in FIGS. 3, 4 and 5 produces a sequence of binarily decreasing charge packets $Q_R/2, Q_R/4, Q_R/8, Q_R/16 \ldots Q_R/2^N$ and that by selectively summing charge packets represented by the terms in this sequence, any analog charge value from zero to $Q_R$ can be obtained. The foregoing sequence can also be used to perform analog-to-digital conversion.

Figure 6:
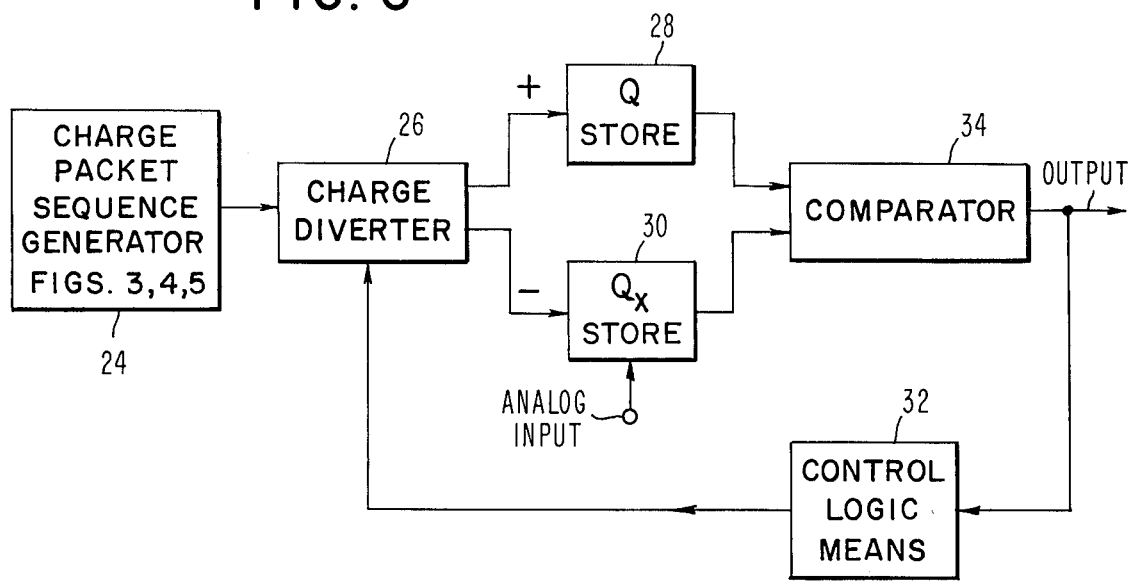
FIG. 6 is a schematic block diagram of another embodiment of an analog-to-digital converter circuit wherein charge packets generated for a binary search sequence are either accumulated at a first storage means or added to an analog signal at a second storage means prior to being applied to a comparator to produce a digital representation.

Referring now to FIG. 6, the charge sequence generator illustrated in FIGS. 3, 4 and 5 is incorporated in an analog-to-digital converter system including a comparator and wherein an input analog signal in the form of a charge quantity $Q_x$ instead of $V_x$ is compared with the charge equivalent of the binary search sequence of expression [1] to produce a digital signal representation of $Q_x$. In FIG. 6, the charge packet sequence generator of FIGS. 3, 4 and 5 is represented as means 24 and produces the sequence $Q_R/2, Q_R/4, Q_R/8 \ldots Q_R/2^N$ described above. This sequence is applied to a charge diverter circuit 26, a known device, where each packet of the sequence is sent to either a first charge storage region 28 or a second charge storage region 30 under control of logic means 32. Charge storage regions 28 and 30 selectively accumulate terms of this sequence and effectively produce the charge equivalent of expression [1]. Charge storage region 30 also contains charge $Q_x$.

An important and unique difference in the operation of the circuit of FIG. 6 over the prior art is that the binary search is performed by only adding the sequentially generated charge packets, to either the charge Q stored on region 28 or to the unknown analog charge $Q_x$ stored on region 30 to obtain the binary search sequence [1] wherein the negative terms in sequence [1] are obtained by adding terms to region 30 rather than subtracting from region 28.

This is best illustrated by an example. For a six bit conversion, assuming that the analog value of $Q_x$ is $19Q_R/64$ which should result in an analog-to-digital conversion to 010011. This value of $Q_x$ is stored at region 30 and the first charge packet search value $Q_R/2$ from generator 24 is first diverted by control logic diverter 26 to be stored at region 28. The value $Q = Q_R/2$ from storage region 28 and $Q_x$ (equal to $19Q_R/64$) is compared at the comparator 34. The compare step indicates that $Q_x < Q$ and thus the first significant bit is "0". In normal binary search techniques the next comparison would be at $Q_R/4$ requiring the next generated charge packet $Q_R/4$ be subtracted from $Q = Q_R/2$ in storage region 28. However in FIG. 6 the previous step wherein $Q_x < Q$ is detected by logic means 32 which controls diverter 26 such that the next term in the sequence $(Q_R/4)$ is added to $Q_x$ at storage region 30 to produce $Q_x'$ equal to $Q_x + Q_R/4$. The next compare step is thus made on $Q = Q_R/2$ and $Q_x' = Q_x +$ plus $Q_R/4$ (which is equal to $19Q_R/64 + Q_R/4 = 35Q_R/64$). In this compare step $Q_x' > Q$ indicating that the next bit is a "1". The "1" bit result is applied to control logic means 32 which controls diverter 26 such that the generated value charge packet $Q_R/8$ is now added to Q at storage region 28. The next compare is now between $Q = Q_R/2 + Q_R/8 = 5Q_R/8$ and $Q_x' = 35Q_R/64$. In this compare step $Q_x' < Q_R$, the third bit is therefore "0" and the next generated term $Q_R/16$ is added to $Q_x'$ to produce $Q_x'' = 35Q_R/64 + Q_R/16 = 39Q_R/64$.

The fourth compare between $Q = 5Q_R8/$ and $Q_x'' = 39Q_R/64$ indicates $Q_x'' < Q$, the fourth bit is "0" and the next generated charge packet $Q_R/16$ is added to $Q_x''$ to produce $Q_x'''$. The fifth compare is now between $Q = 5Q_R/8$ and $Q_x''' = 39Q_R/64 + Q_R/16 = 43Q_R/64$. Thus $Q_x''' > Q$, the fifth bit is a "1" and the next generated term $Q_R/32$ is added to Q at storage region 28. The sixth compare is now between $Q = 5Q_R/8 + Q_R/32 = 42Q_R/64$ and $Q_x''' = 43Q_R/64$ therefore $Q_x''' > Q$ and the sixth bit is "1". In summary, if a determined bit is a "1" the next charge packet is diverted to storage region 28, if the determined bit is a "0" the next charge packet is diverted to storage region 30.

It is to be noted that the correct digital representation 010011 was produced and only N search values were necessary and only N compare steps occurred in the particular example wherein N was selected equal to 6. The structure of FIG. 6 can be implemented with state-of-the-art charge-coupled-device technology using storage wells, charge diverter electrodes and a conventional comparator technique. Control logic means 32 is a simple unit which responds to binary "1"s or "0"s from comparator 34 to control diverter 26 and can be implemented in conventional logic technique.

Figure 7:
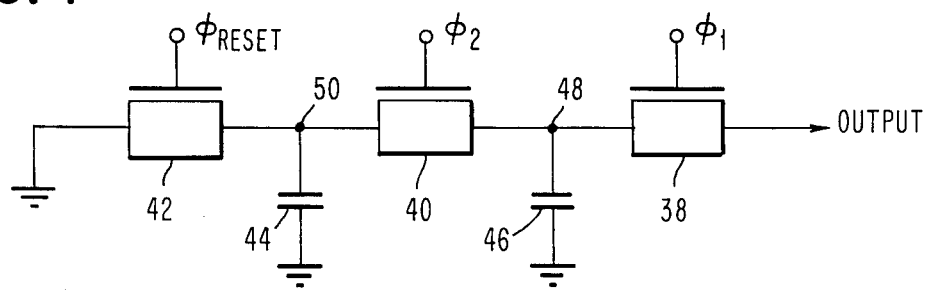
FIG. 7 is a schematic illustration of a bucket brigade circuit which may be employed as a digital-to-analog converter in the present invention.
Figure 8:
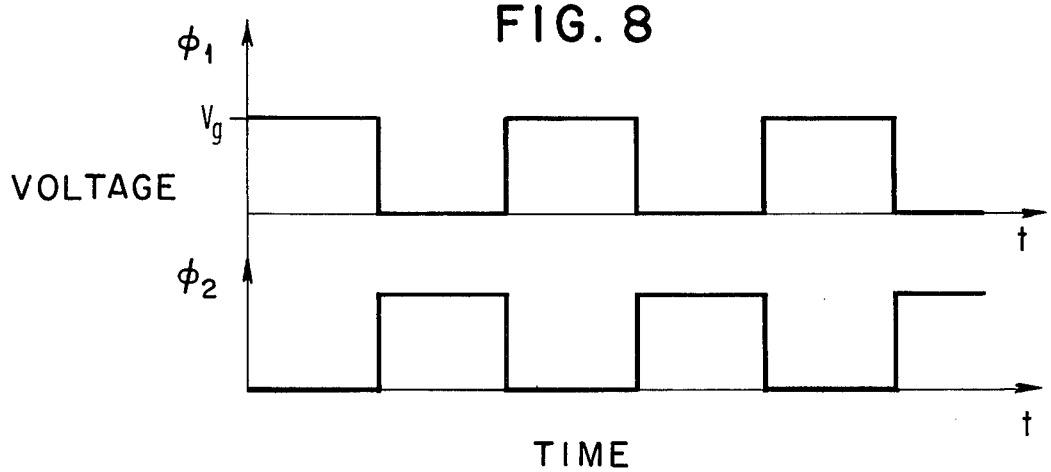
FIG. 8 is an illustration of a waveform diagram used in explaining the operation of the embodiment of FIG. 7.

The embodiment of the digital-to-analog converter illustrated in FIGS. 3, 4 and 5 is one example of a charge transfer device. It is known in the art that an equivalent charge transfer device can be provided in a bucket brigade embodiment. FIG. 7 illustrates a bucket brigade circuit which functions in essentially the same manner as the charge-coupled-device of FIGS. 3, 4 and 5 and which can be employed as digital-to-analog converter 12 in the combination of FIGS. 1 and 6. The bucket brigade circuit includes three actuable devices, 38, 40 and 42 such as field effect transistors and two equal capacitors 44 and 46. FIG. 8 illustrates the waveforms and sequence of operation associated with the bucket brigade circuit of FIG. 7.

In FIG. 7 the two equal capacitors 44 and 46 are used to divide charge and to generate the previously described binarily decreasing sequence. Initially a phase 1 signal having an amplitude of Vg is applied through transistor 42 and raises node 48 to $V_R = Vg - V_{th}$ where $V_{th}$ is the threshold level of transistor 38. Node 50 is at ground level and at this time the phase 2 signal occurs which closes transistor switch 40. Capacitors 44 and 46 are now connected in parallel and the voltage at both nodes 48 and 50 go to $V_R/2$. The phase 2 signal now goes off and transistor switch 40 opens and node 48 is charged back up to $V_R = Vg - V_{th}$. This results in a charge packet transferred to the output equal to $Q = C_{46}V_R/2$ which is the result of the first cycle of operation of the bucket brigade device. The device continues to cycle, that is transistor switch 40 closes and opens and node 48 is charged back up to $V_R$ repetitively. A sequence of charge packets is generated equal to $Q = C_{46}V_R/4, C_{46}V_R/8, C_{46}V_R/16$ etc.

An advantage of the circuit of FIG. 7 is that since node 48 is always charged back to the same voltage $V_R$, the effect of non-linear or parasitic capacitance on that node is cancelled.

Figure 9:
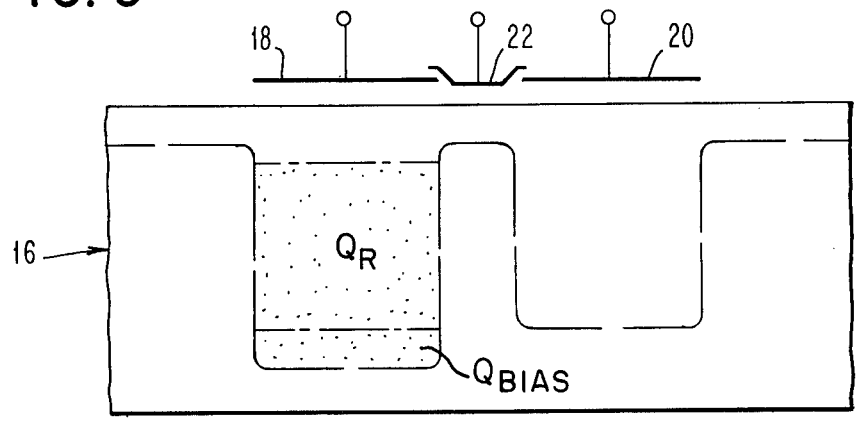
FIGS. 9, 10 and 11 are schematic illustrations of a charge-coupled-device incorporating an offset bias for threshold variation compensation.
Figure 10:
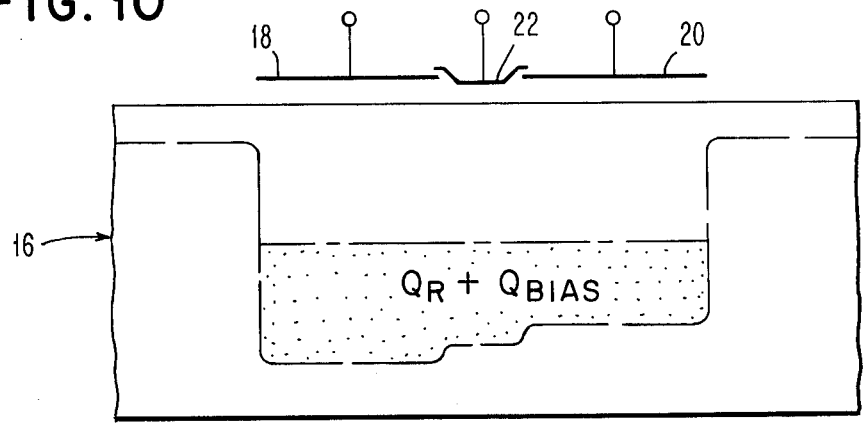
Figure 11:
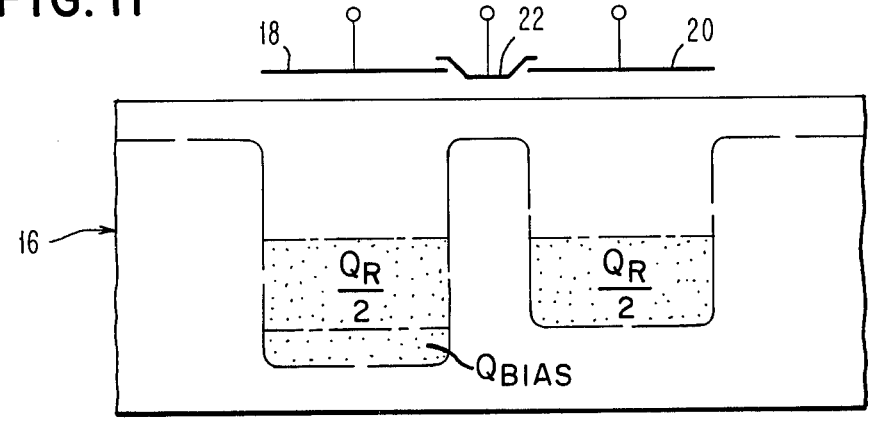

FIGS. 9, 10, and 11 indicate an embodiment within the operation is equivalent to FIGS. 3, 4, and 5 except a bias charge Q bias is always stored under electrode 18 due to a higher voltage applied to electrode 18 than to electrode 20. The charge Q bias effectively cancels any differences in threshold voltages of electrodes 18 and 20. The charge on top of Q bias is divided in two as indicated in FIG. 11 and so on as previously described. The charge is removed from under electrode 20.

While the invention has been particularly shown and described with reference to preferred embodiments thereof, it will be understood by those skilled in the art that the foregoing and other changes in form and details may be made therein without departing from the spirit and scope of the invention.

What is claimed is:

1. An analog-to-digital converter circuit of the type employing successive approximation binary search techniques comprising:

a source of analog input signal, a sequence generating circuit for generating a binarily decreasing sequence of electrical charge quantities of the form $Q = Q_R/2$, $Q_R/4$, $Q_R/8$ up to $Q_R/2^N$ where $Q_R$ is a predetermined quantity of electrical charge and N is a positive integer, a first storage means for sequentially accumulating a first plurality of first selected ones of said charge quantities from said sequence of electrical charge quantities.

a second storage means for storing said input analog signal and for sequentially accumulating and adding to said analog signal a second plurality of other selected ones of said charge quantities from said sequence of electrical charge quantities, and means including an electrical charge diverting means, a comparator circuit and a logic control means connected to said sequence generating circuit, and said first and second storage means for sequentially comparing said accumulated charge quantities in said first and second storage means and for directing said charge quantities to said first and second storage means in accordance with said comparisons to produce an output signal representative of said comparisons, said logic control means being responsive to the output of said comparison means to provide an input signal to said diverting means such that when a comparison between the quantity stored in said first electrical charge storage means and the quantity stored in said second electrical charge storage means indicates that the quantity stored in said first electrical charge storage means is greater than the quantity stored in said second electrical charge storage means, a "0" binary value is manifested and said logic control means controls said electrical charge diverting means to direct the next successive one of said binarily decreasing sequence of electrical charge quantities to said second electrical charge storage means for addition to the quantity stored therein, and that when a comparison between the quantities stored in said first and second electrical charge storage means indicates that the quantity stored in said second electrical charge storage means is greater than the quantity stored in said first electrical charge storage means, a "1" binary value is manifested and said logic control means controls said electrical charge diverting means to direct the next successive one of said binarily decreasing sequence of electrical charge quantities to said first electrical charge storage means for addition to the quantity stored therein, said comparison, diverting and storage operations continuing for N occurrences, where N is said positive integer, to provide an N bit digital signal representative of said input analog signal.

2. A generating circuit according to claim 1 wherein said first and second charge carrier storage means includes a semiconductor substrate, a first storage electrode coupled to said semiconductor substrate for forming a first potential well for storing charge carriers in said substrate, a second storage electrode coupled to said semiconductor substrate for forming a second potential well for storing charge carriers in said substrate, and wherein said charge carrier transfer means includes a transfer electrode coupled to said substrate and disposed between said first and second storage electrodes for transferring said selected amounts of charge carriers between said first and second potential wells.

3. An analog-to-digital converter circuit of the type employing successive approximation binary search techniques comprising:

a source of analog input signal, a circuit for generating a binarily decreasing sequence of electrical signal quantities including a first electrical charge storage means adapted to store up to a predetermined quantity of electrical charge $Q_R$, a second electrical charge storage means also adapted to store up to said predetermined quantity of electrical charge $Q_R$, and an electrical charge transfer means associated with said first and second electrical charge storage means for transferring from said first storage means to said second storage means and from said second storage means to said first storage means any selected amount of electrical charge of said predetermined quantity of electrical charge $Q_R$ for producing a binarily decreasing sequence of electrical charge quantities from said sequence generating means of the form $Q=Q_R/2$, $Q_R/4$, $Q_R/8$ up to $Q_R/2^N$ where N is a positive integer, a third electrical charge storage means for accumulating selected ones of said electrical charge quantities from said sequence generating circuit, a fourth electrical charge storage means for storing said input analog signal and for adding other selected ones of said electrical charge quantities from said sequence generator to said input analog signal, an electrical charge diverting means connected between said sequence generating circuit and said third and fourth storage means for directing first selected ones of said sequence of electrical charge quantities from said sequence generating circuit to said third storage means and other selected ones of said sequence of electrical charge quantities from said sequence generating circuit to said fourth storage means, said first selected ones of said sequence of electrical charge quantities being accumulated at said third electrical charge storage means and said other selected ones of said sequence of electrical charge quantities being accumulated and added to said input analog signal at said fourth electrical charge storage means to sequentially produce two separate accumulated quantities of electrical charge quantities, a comparator circuit having a first input terminal connected to said third electrical charge storage means and a second input terminal connected to said fourth electrical charge storage means for comparing the accumulated electrical charge in each of said third and fourth storage means and a logic control means connected between the output of said comparator circuit and to said electrical charge diverting means for controlling said electrical charge diverting means for directing said first selected electrical charge quantities and said other selected electrical charge quantities of said binarily decreasing sequence of electrical charge quantities from said sequence generating circuit selectively to said third and fourth storage means as a result of said compared accumulation of said comparator circuit, said logic control means being responsive to the output of said comparison means to provide an input signal to said diverting means such that when a comparison between the quantity stored in said third electrical charge storage means and the quantity stored in said fourth electrical charge storage means indicates that the quantity stored in said third electrical charge storage means is greater than the quantity stored in said fourth electrical charge storage means, a "0" binary value is manifested and said logic control means controls said electrical charge diverting means to direct the next successive one of said binarily decreasing sequence of electrical charge quantities to said fourth electrical charge storage means for addition to the quantity stored therein, and that when a comparison between the quantities stored in said third and fourth electrical charge storage means indicates that the quantity stored in said fourth electrical charge storage means is greater than the quantity stored in said third electrical charge storage means, a "1" binary value is manifested and said logic control means controls said electrical charge diverting means to direct the next successive one of said binarily decreasing sequence of electrical charge quantities to said third electrical charge storage means for addition to the quantity stored therein, said comparison, diverting and storage operations continuing for N occurrences, where N is said positive integer, to provide an N bit digital signal representative of said input analog signal.

4. An analog-to-digital converter circuit according to claim 3 wherein said first and second charge carrier storage means includes a semiconductor substrate, a first storage electrode coupled to said semiconductor substrate for forming a first potential well for storing charge carriers in said substrate, a second storage electrode coupled to said semiconductor substrate for forming a second potential well for storing charge carriers in said substrate, and wherein said charge carrier transfer means includes a transfer electrode coupled to said substrate and disposed between said first and second storage electrodes for transferring said selected amounts of charge carriers between said first and second potential wells.

* * * * *